US010931006B2

(12) United States Patent
Liu et al.

(10) Patent No.: US 10,931,006 B2
(45) Date of Patent: Feb. 23, 2021

(54) CHIP ANTENNA

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Jia Liu, Yokohama Kanagawa (JP); Hiroshi Ota, Misato Saitama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 21 days.

(21) Appl. No.: 16/289,333

(22) Filed: Feb. 28, 2019

(65) Prior Publication Data

US 2019/0379112 A1 Dec. 12, 2019

(30) Foreign Application Priority Data

Jun. 7, 2018 (JP) ............................ JP2018-109874

(51) Int. Cl.

| | |
|---|---|
| ***H01L 35/00*** | (2006.01) |
| ***H01Q 1/36*** | (2006.01) |
| ***H01Q 3/44*** | (2006.01) |
| ***H01Q 1/38*** | (2006.01) |
| ***H01Q 9/04*** | (2006.01) |
| ***H01Q 1/52*** | (2006.01) |
| ***H01Q 1/24*** | (2006.01) |

(52) U.S. Cl.

CPC ............... *H01Q 1/38* (2013.01); *H01Q 1/243* (2013.01); *H01Q 1/526* (2013.01); *H01Q 9/0407* (2013.01)

(58) Field of Classification Search

None

See application file for complete search history.

(56) References Cited

U.S. PATENT DOCUMENTS

| | | | | |
|---|---|---|---|---|
| 7,061,434 | B2 | 6/2006 | Aoyama et al. | |
| 7,421,245 | B2 | 9/2008 | Lieffort et al. | |
| 8,022,886 | B2 | 9/2011 | Kai et al. | |
| 9,190,732 | B2 * | 11/2015 | Fujii | H01Q 1/38 |
| 9,558,440 | B2 | 1/2017 | Ikemoto et al. | |
| 2011/0148728 | A1 * | 6/2011 | Yoshioka | H01Q 1/40 343/787 |
| 2016/0181698 | A1 * | 6/2016 | Goto | H01Q 5/35 343/870 |

FOREIGN PATENT DOCUMENTS

| | | | |
|---|---|---|---|
| JP | 2003258530 | A | 9/2003 |
| JP | 2004304783 | A | 10/2004 |
| JP | 3654235 | B2 | 6/2005 |
| JP | 2007523563 | A | 8/2007 |
| JP | 4561932 | B2 | 10/2010 |
| JP | 2011066628 | A | 3/2011 |
| JP | 4806373 | B2 | 11/2011 |

* cited by examiner

*Primary Examiner* — Anh Q Tran

(74) *Attorney, Agent, or Firm* — Kim & Stewart LLP

(57) ABSTRACT

According to one embodiment, a chip antenna comprises a first electrode, a second electrode spaced from the first electrode, a first antenna conductor connected to the first electrode and the second electrode, and a second antenna conductor connected to at least one of the first electrode and the second electrode. An insulator surrounds the first electrode, the second electrode, the first antenna conductor, and the second antenna conductor.

13 Claims, 8 Drawing Sheets

CHIP ANTENNA

CROSS-REFERENCE TO RELATED APPLICATION

This application is based upon and claims the benefit of priority from Japanese Patent Application No. 2018-109874, filed Jun. 7, 2018, the entire contents of which are incorporated herein by reference.

FIELD

Embodiments described herein relate generally to a chip antenna.

BACKGROUND

A chip antenna is mounted on many communication devices, such as a wireless local area network (LAN) device and a mobile phone. The chip antenna includes an antenna conductor which transmits and receives radio waves and is provided in an insulating dielectric material. The antenna may be miniaturized by bending the antenna conductor within the dielectric material.

If the antenna conductor is provided in the dielectric material, a so-called wavelength shortening effect in which propagating radio waves at shortened wavelengths is obtained, and thereby, the antenna is further downsized. Due to a recent spread of the internet of things (IOT), development of a chip antenna with a small size, a high gain, omnidirectional type and wideband characteristics has been actively performed.

The chip antenna is usually mounted on a substrate in the communication device. In such a case, a communication frequency, which is the frequency of the radio wave to be transmitted and received by the chip antenna, may vary depending on properties of the surrounding case of the communication device, a metal body in the communication device, the substrate material, and the like. Generally, adjustment of the communication frequency is performed by an external adjustment circuit such as a chip inductor, a design change of the chip antenna, or the like. However, when an external adjustment circuit is used, a circuit configuration of the communication device is complicated, and it is difficult to manufacture the communication device. Accordingly, there has been a demand for a chip antenna for which the communication frequency can be easily adjusted by design changes.

DETAILED DESCRIPTION

Figure 1A:
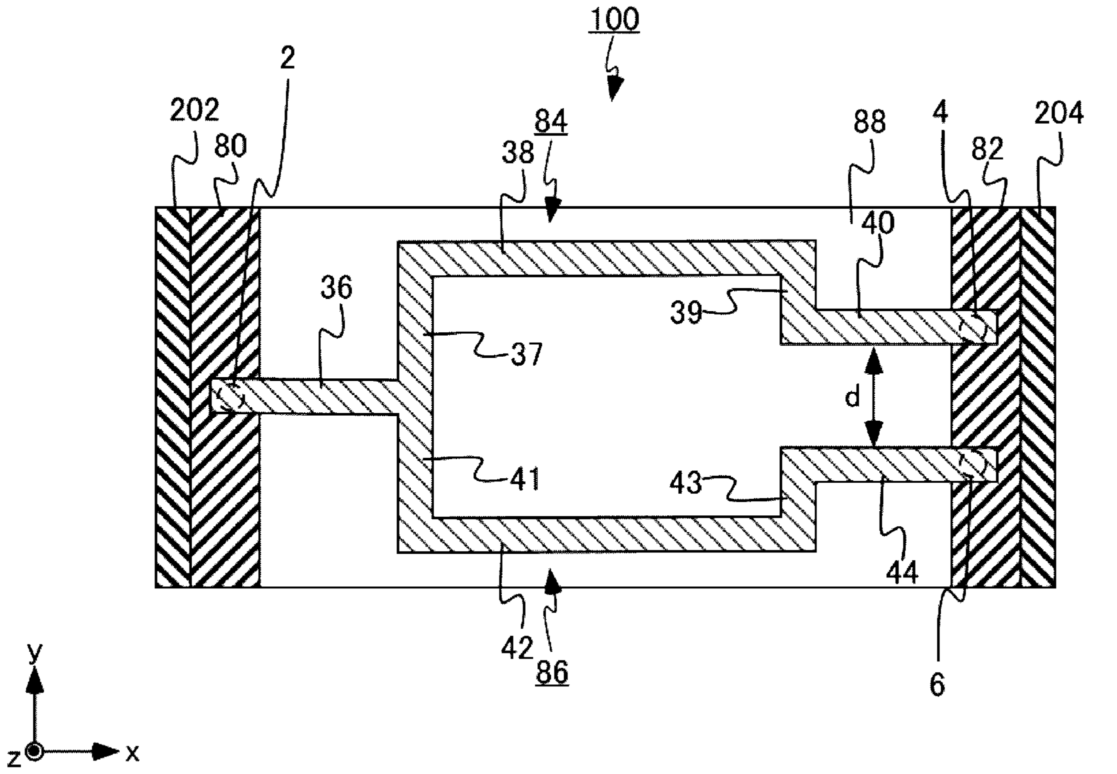
FIGS. 1A and 1B are schematic diagrams of a chip antenna according to a first embodiment.

Example embodiments provide a chip antenna capable of being easily adjusted in communication frequency and capable of handling several frequencies.

In general, according to one embodiment, a chip antenna, comprises a first electrode, a second electrode spaced from the first electrode, a first antenna conductor connected to the first electrode and the second electrode, and a second antenna conductor connected to at least one of the first electrode and the second electrode. An insulator material surrounds the first electrode, the second electrode, the first antenna conductor, and the second antenna conductor.

Hereinafter, example embodiments will be described with reference to the drawings. In the drawings, the same reference numerals or symbols are attached to the same or substantially similar elements or aspects, and description of repeated elements/aspects may be omitted.

In the present specification, to describe a positional relationship between components or the like, an upward direction of the drawing is described as "upper" and a downward direction of the drawing is described as "lower". However, the concepts of the "upper" and "lower" as used herein do not necessarily correspond to a relationship with a direction of gravity.

First Embodiment

A chip antenna according to the first embodiment includes a first electrode, a second electrode, a first antenna conductor connected to the first electrode and the second electrode, a second antenna conductor connected to at least one of the first electrode and the second electrode, and an insulator provided around the first electrode, the second electrode, the first antenna conductor, and the second antenna conductor.

Figure 1B:
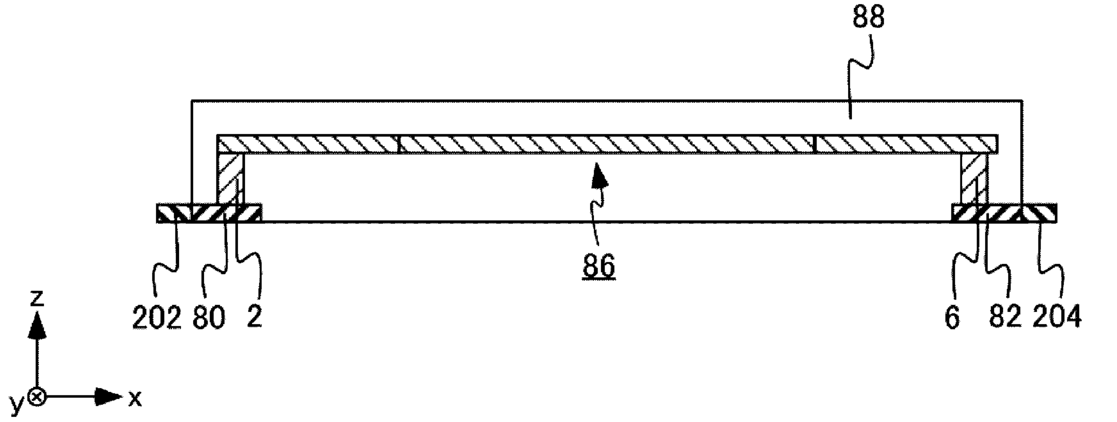

FIGS. 1A and 1B are schematic diagrams of a chip antenna 100 according to the first embodiment.

An x-axis, a y-axis perpendicular to the x-axis, and a z-axis perpendicular to the x-axis and the y-axis are defined in the figures. FIG. 1A is a schematic diagram of the chip antenna 100 in a plane parallel to an xy plane. FIG. 1B is a schematic diagram of the chip antenna 100 in a plane parallel to an xz plane.

The chip antenna 100 includes a first electrode 80, a second electrode 82, a first antenna conductor 84, a second antenna conductor 86, and an insulator 88.

The first electrode 80 is connected to a first substrate electrode 202 when mounted on a substrate. The first substrate electrode 202 is connected to, for example, an impedance matching circuit, a band pass filter, a power amplifier, a low noise amplifier, and the like, which are not specifically illustrated.

The second electrode 82 is connected to a second substrate electrode 204 when mounted on the substrate. The second substrate electrode 204 is provided on a radio wave transmission and reception side.

The first antenna conductor 84 is connected to the first electrode 80 and the second electrode 82.

The second antenna conductor 86 is connected to at least one of the first electrode 80 and the second electrode 82. In the chip antenna 100 illustrated in FIGS. 1A and 1B, the second antenna conductor 86 is connected to both the first electrode 80 and the second electrode 82.

The first electrode 80, the second electrode 82, the first antenna conductor 84, and the second antenna conductor 86 are formed of a material having a high electrical conductivity. The first electrode, the second electrode, the first antenna conductor, and the second antenna conductor are formed of, for example, silver (Ag), copper (Cu), gold (Au), aluminum (Al), nickel (Ni), or the like, or an alloy of these elements. The first electrode, the second electrode, the first antenna conductor, and the second antenna conductor may be formed of other conductive materials such as a conductive polymer.

The insulator 88 is provided around the first electrode 80, the second electrode 82, the first antenna conductor 84, and the second antenna conductor 86. It is preferable to use, for example, a dielectric material having a known high permittivity, a resin, or the like as the insulator 88. It is preferable to use, for example, low temperature co-fired ceramics (LTCC), flame retardant type 4 (FR4), polyphenylene sulfide (PPS), liquid crystal polymer (LCP), polyamide (PA), and the like as the insulator 88.

A shape of the insulator 88 is a rectangle as viewed in FIG. 1B. The first electrode 80 and the second electrode 82 are in contact with a lower surface of the insulator 88 as depicted in FIG. 1B.

The first electrode 80, the second electrode 82, the first antenna conductor 84, the second antenna conductor 86, and the insulator 88 that form the chip antenna 100 according to the first embodiment may be manufactured by using known methods.

Figure 2A:
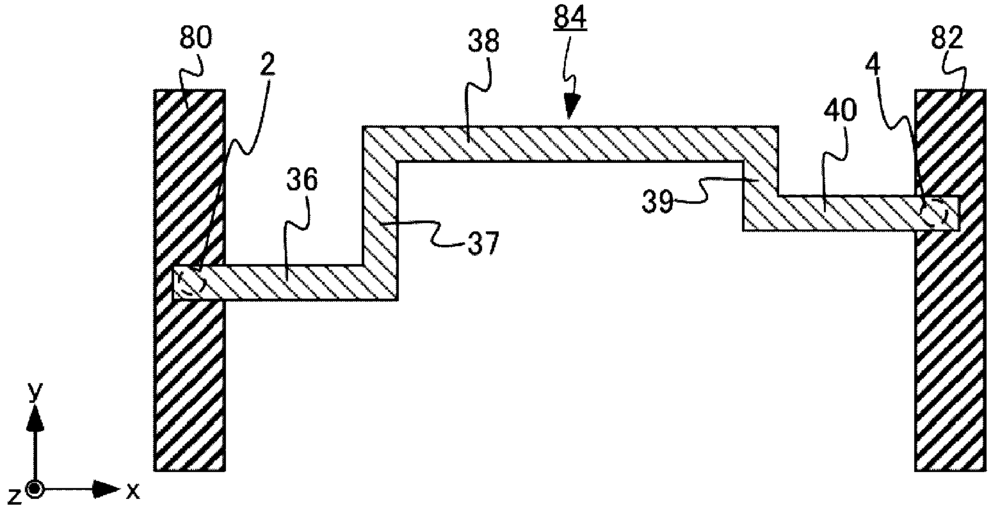
FIGS. 2A to 2C are schematic diagrams of a first antenna conductor and a second antenna conductor according to a first embodiment.
Figure 2B:
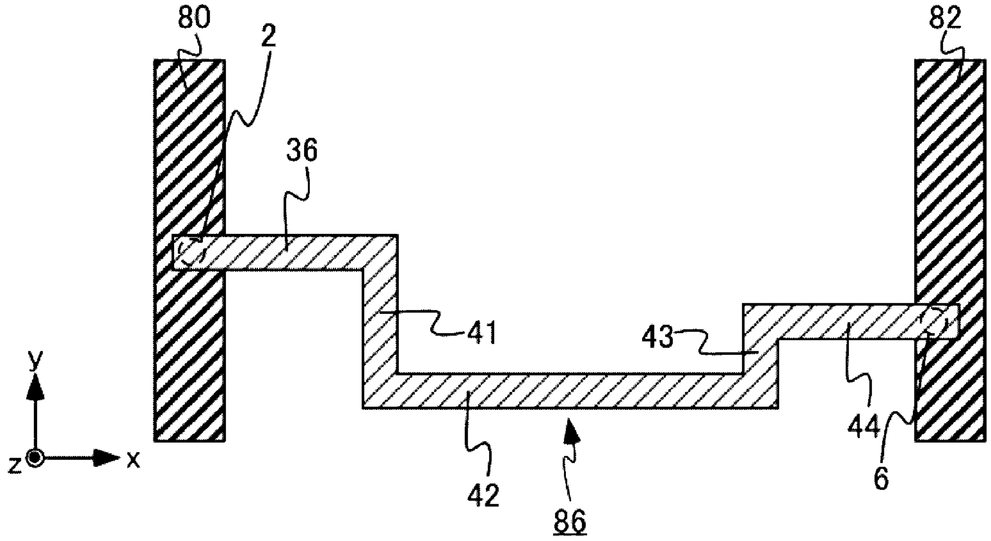
Figure 2C:
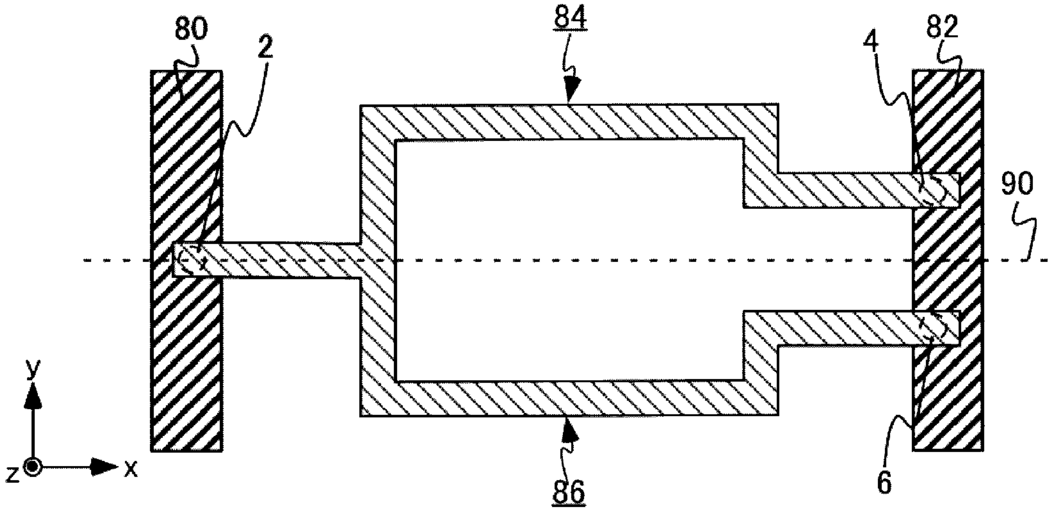

FIGS. 2A to 2C are schematic diagrams of the first antenna conductor 84 and the second antenna conductor 86 according to the first embodiment. FIG. 2A is a schematic diagram of the first antenna conductor 84 in a plane parallel to the xy plane. FIG. 2B is a schematic diagram of the second antenna conductor 86 in a plane parallel to the xy plane. FIG. 2C is a schematic diagram of the first antenna conductor 84 and the second antenna conductor 86 in a plane parallel to the xy plane. The first electrode 80 and the second electrode 82 are also illustrated together.

The first antenna conductor 84 includes a first via 2, a conductor portion 36, a conductor portion 37, a conductor portion 38, a conductor portion 39, a conductor portion 40, and a second via 4. The conductor portion 36, the conductor portion 37, the conductor portion 38, the conductor portion 39, and the conductor portion 40 are, for example, planar and rod-shaped conductors, and plane thereof are all arranged in parallel to the xy plane.

One end of the first via 2 is connected to the first electrode 80, and the other end extends in the z direction (e.g., direction perpendicular to the page of FIG. 2C). One end of the conductor portion 36 is connected to the other end of the first via 2, and the other end extends in the x direction (a rightward page direction of FIG. 2C). One end of the conductor portion 37 is connected to the other end of the conductor portion 36, and the other end extends in the y direction (e.g., an upward direction of FIG. 2A). One end of the conductor portion 38 is connected to the other end of the conductor portion 37, and the other end extends in the x direction (e.g., a rightward page direction of FIG. 2A). One end of the conductor portion 39 is connected to the other end of the conductor portion 38, and the other end extends in the −y direction (e.g., a downward page direction of FIG. 2A).

One end of the conductor portion 40 is connected to the other end of the conductor portion 39, and the other end extends in the x direction (e.g., a rightward page direction in FIG. 2A). One end of the second via 4 is connected to the other end of the conductor portion 40, and the other end extends in the −z direction (e.g., a direction perpendicular to the surface of page in FIG. 2A) to be connected to the second electrode 82.

The second antenna conductor 86 includes the first via 2, the conductor portion 36, a conductor portion 41, a conductor portion 42, a conductor portion 43, a conductor portion 44, and a third via 6. The conductor portion 41, the conductor portion 42, the conductor portion 43, and the conductor portion 44 are, for example, planar and rod-shaped conductors, and planes thereof are all arranged in parallel to the xy plane.

One end of the conductor portion 41 is connected to the other end of the conductor portion 36, and the other end extends in the −y direction. One end of the conductor portion 42 is connected to the other end of the conductor portion 41, and the other end extends in the x direction. One end of the conductor portion 43 is connected to the other end of the conductor portion 42, and the other end extends in the y direction. One end of the conductor portion 44 is connected to the other end of the conductor portion 43, and the other end extends in the x direction. One end of the third via 6 is connected to the other end of the conductor portion 44 and the other end extends in the −z direction to be connected to the second electrode 82.

The first via 2 and the first conductor portion 36 are used in common by the first antenna conductor 84 and the second antenna conductor 86 in this example.

However, in some examples, the chip antenna 100 may not have a first electrode 80 and the first via 2 and the first substrate electrode 202 may be directly connected to each other. In this case, it would be understood that the first via 2 itself corresponds to and/or incorporates the first electrode 80.

Likewise, for example, the chip antenna 100 may not include a second electrode 82 and the second via 4 and the third via 6 may be directly connected to the second substrate electrode 204. In this case, it would be understood that the second via 4 itself corresponds to and/or incorporates the second electrode 82. Since the second antenna conductor 86 is also connected to the second via 4 through the third via 6 and the second substrate electrode 204, it may also be stated the second antenna conductor 86 is connected to the second via 4 (second electrode) in the present specification.

In the chip antenna 100 according to the first embodiment, a first length of the first antenna conductor 84 is equal to a second length of the second antenna conductor 86. In this case, a communication frequency of the first antenna conductor 84 is equal to a communication frequency of the second antenna conductor 86.

The first antenna conductor 84 and the second antenna conductor 86 are antenna conductors in a loop antenna. The first antenna conductor 84 and the second antenna conductor 86 form an antenna conductor of a dual loop antenna. The first antenna conductor 84 and the second antenna conductor 86 are parallel to the xz plane and are plane-symmetric with respect to a first plane 90 which is virtually depicted in FIG. 2C.

In the chip antenna 100 illustrated in FIGS. 1A to 2C, the first antenna conductor 84 and the second antenna conductor 86 are provided inside the insulator 88 of the chip antenna 100. However, some part of the first antenna conductor 84 or some part of the second antenna conductor 86 may be provided on a surface of the insulator 88. However, in order to obtain the wavelength shortening effect due to permittivity of the insulator 88, it is preferable to provide at least a part of the first antenna conductor 84 and at least a part of the second antenna conductor 86 inside the insulator 88.

It is preferable to separate the conductor portion 40 and the conductor portion 44 from each other by a distance d, as depicted in FIG. 1A.

The aspects of the first antenna conductor 84 and the second antenna conductor 86 are not limited to those described above.

Figure 3:
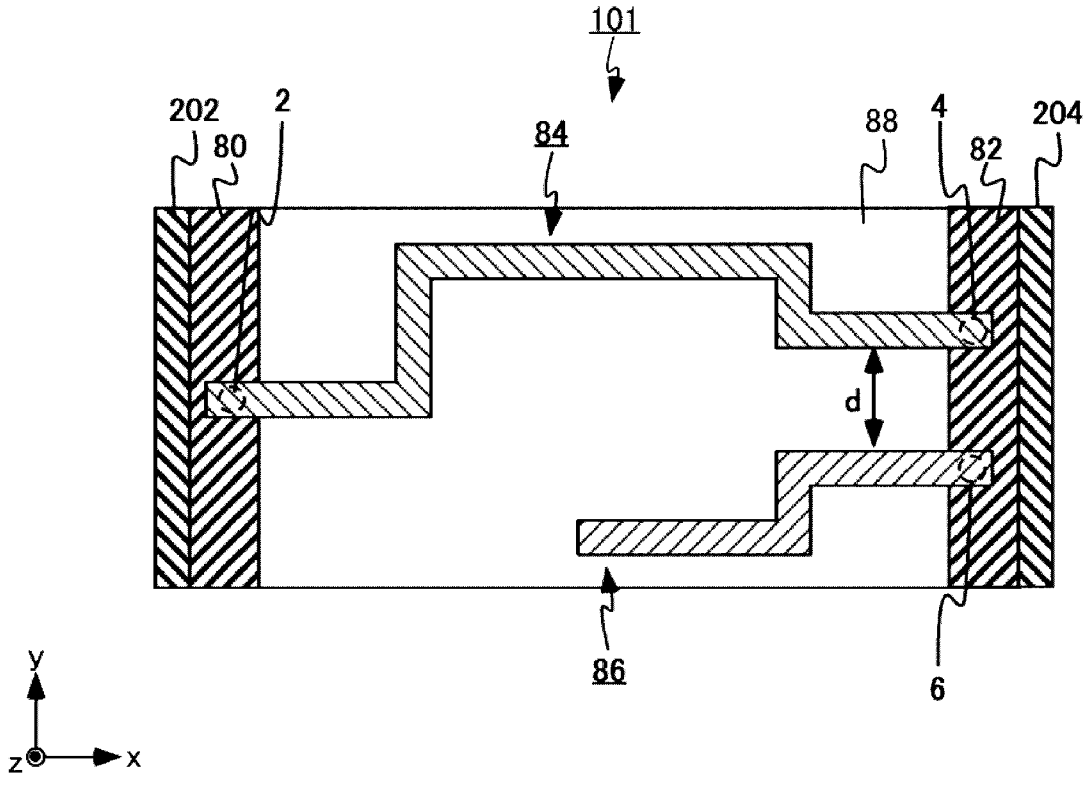
FIG. 3 is a schematic diagram of a chip antenna according to a first aspect of the first embodiment.

FIG. 3 is a schematic diagram of the chip antenna 101 according to a first aspect of the first embodiment. The second antenna conductor 86 depicted in FIG. 3 does not include the conductor portion 41 illustrated in FIG. 2B. Thereby, the second antenna conductor 86 is only connected to the second electrode 82 and is not connected to the first electrode 80 (via sixth conductor portion 41). In other words, the second antenna conductor 86 is only indirectly connected to the first electrode 80 through the second electrode 82, the second via 4, and the first antenna conductor 84.

Figure 4:
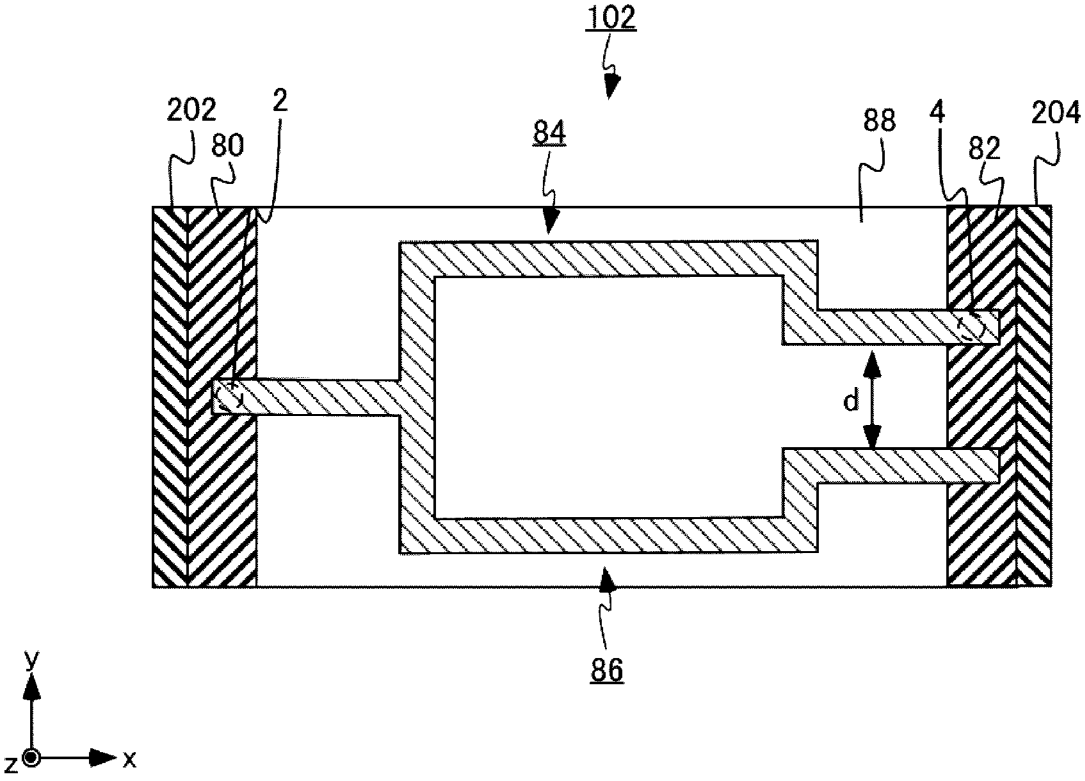
FIG. 4 is a schematic diagram of a chip antenna according to a second aspect of the first embodiment.

FIG. 4 is a schematic diagram of the chip antenna 102 according to a second aspect of the first embodiment. The second antenna conductor 86 depicted in FIG. 4 does not have the third via 6 illustrated in FIG. 2B. Thereby, the second antenna conductor 86 is connected to a first electrode 80, and a first length of the first antenna conductor is greater than a second length of the second antenna conductor by the length of the third via 6.

Figure 5:
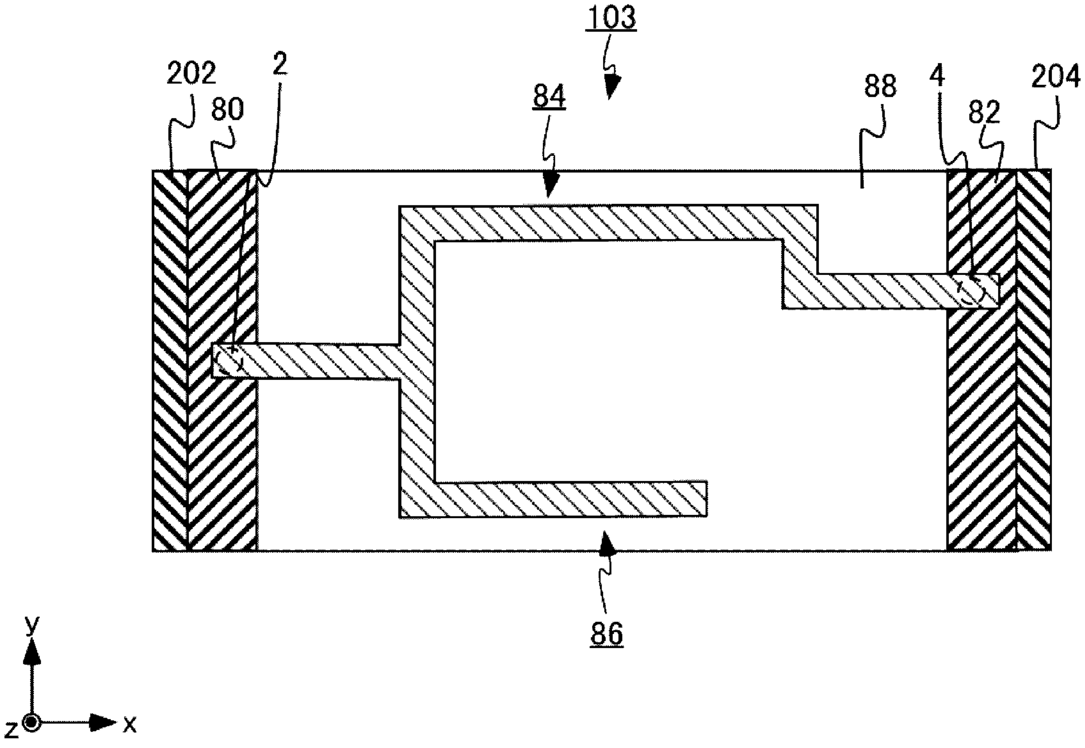
FIG. 5 is a schematic diagram of a chip antenna according to a third aspect of the first embodiment.

FIG. 5 is a schematic diagram of the chip antenna 103 according to a third aspect of the first embodiment. The second antenna conductor 86 does not have the conductor portion 43, the conductor portion 44, and the third via 6 illustrated in FIG. 2B.

Figure 6:
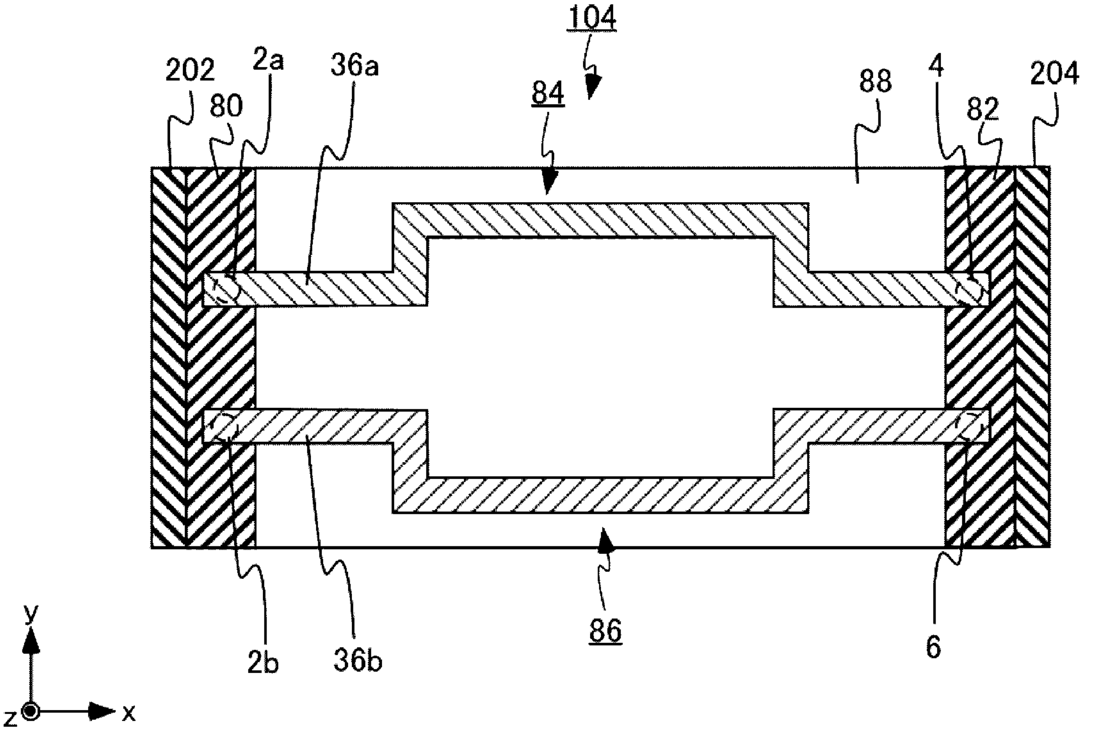
FIG. 6 is a schematic diagram of a chip antenna according to a fourth aspect of the first embodiment.

FIG. 6 is a schematic diagram of the chip antenna 104 according to the fourth aspect of the first embodiment. In the chip antenna 104, the first antenna conductor 84 and the second antenna conductor 86 have a first conductor portion 36*a* and the first conductor portion 36*b*, respectively, unlike the chip antenna 100 illustrated in FIGS. 1A to 2C. The via 2*a* connects the first substrate electrode 202 to the first conductor portion 36*a*, and the via 2*b* connects the first substrate electrode 202 to the first conductor portion 36*b*.

Next, operation effects of the chip antenna according to the first embodiment will be described.

In one aspect of the chip antenna according to the first embodiment, the chip antenna 100 illustrated in FIGS. 1A to 2C includes the first electrode 80, the second electrode 82, the first antenna conductor 84 connected to the first electrode 80 and the second electrode 82, the second antenna conductor 86 connected to the first electrode 80 and the second electrode 82, and the insulator 88 provided around the first electrode 80, the second electrode 82, the first antenna the conductor 84, and the second antenna conductor 86. The first length of the first antenna conductor is equal to the second length of the second antenna conductor. In addition, the first antenna conductor 84 and the second antenna conductor 86 are plane-symmetric with respect to the first plane 90.

In the chip antenna 100, it is possible to operate each of the first antenna conductor 84 and the second antenna conductor 86 at a predetermined same communication frequency.

In addition, in the chip antenna according to the first embodiment, it is possible to adjust the communication frequency by not including a part of a conductor portion and/or a via as will be further described below. Adjusting the communication frequency may thus be performed by excluding the manufacturing process for a part of the conductor portion and/or a process of manufacturing a via from a manufacturing scheme of the chip antenna 100. That is, adjusting the communication frequency may be performed by a manufacturing process similar to the overall manufacturing process of the chip antenna 100. Accordingly, a chip antenna having an adjusted communication frequency is easily manufactured. In addition, since such a chip antenna is based on an established design of the chip antenna 100, it is possible to easily and precisely adjust the communication frequency of such a chip antenna as compared with a case where an entirely new chip antenna is designed to achieve an adjusted communication frequency.

In the chip antenna 101 illustrated in FIG. 3, the second antenna conductor 86 does not include the conductor portion 41. In this case, the first antenna conductor 84 and the second antenna conductor 86 function as an antenna conductor that includes the conductor portion 36, the conductor portion 37, the conductor portion 38, the conductor portion 39, the conductor portion 40, the second via 4, the second electrode 82, the third via 6, the conductor portion 44, the conductor portion 43, and the conductor portion 42, as a whole. As a result, since an overall antenna length is lengthened as a whole, it is possible to lower the communication frequency as compared with the chip antenna 100.

In the chip antenna 102 illustrated in FIG. 4, the second antenna conductor 86 does not include the third via 6. Accordingly, the communication frequency of the second antenna conductor 86 increases to be more than the communication frequency of the first antenna conductor 84 by a length of the third via 6. Thus, it is possible to transmit and receive radio waves of a first predetermined frequency by using the first antenna conductor 84 and to transmit and receive radio waves of a frequency higher than the first predetermined frequency by using the second antenna conductor 86.

In the chip antenna 103 illustrated in FIG. 5, the second antenna conductor 86 does not include the conductor portion 43, the conductor portion 44, and the third via 6. Thus, since the antenna length is shortened, the communication frequency of the second antenna conductor 86 is further increased as compared with the chip antenna 102 illustrated in FIG. 4. Thus, it is possible to transmit and receive radio waves at a higher frequency by using the second antenna conductor 86.

According to the circuit device of the first embodiment, it is possible to easily adjust the communication frequency and to provide a chip antenna capable of coping with multiple frequencies.

Second Embodiment

In the chip antenna according to the second embodiment, the second antenna conductor 86 is connected to the first electrode 80 and the second electrode 82, and the first antenna conductor 84 includes a first portion (comprising the conductor portion 38, the conductor portion 39, and the conductor portion 40) having a first shape and a second portion (comprising the conductor portion 37) having a second shape and connected to the first portion. The second antenna conductor 86 is different from the second antenna conductor according to the first embodiment in that the second antenna conductor 86 includes a third portion (comprising the conductor portion 44, the conductor portion 45, and a conductor portion 46) having a first shape, and a fourth portion (comprising the conductor portion 43) having a third shape different from the second shape and connected to the third portion. The other points may be as described in conjunction with the first embodiment.

Figure 7:
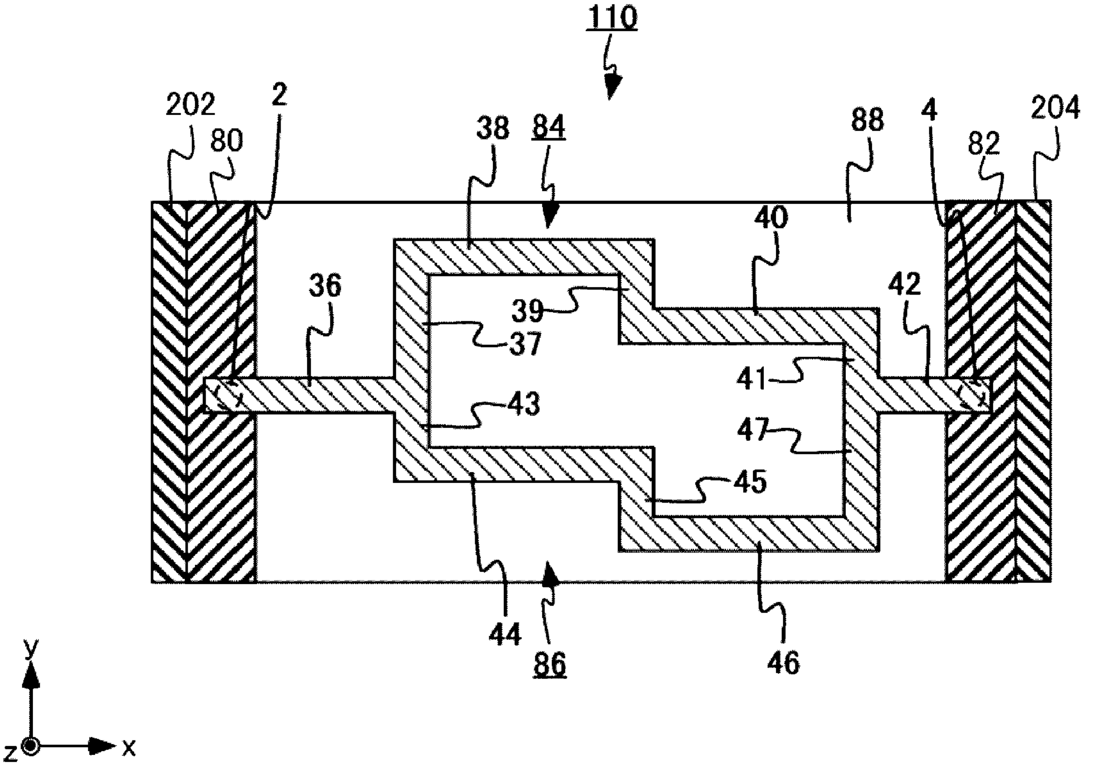
FIG. 7 is a schematic diagram of a chip antenna according to a second embodiment.

FIG. 7 is a schematic diagram of a chip antenna 110 according to the second embodiment.

The first antenna conductor 84 includes the first via 2, the conductor portion 36, the conductor portion 37, the conductor portion 38, the conductor portion 39, the conductor portion 40, the conductor portion 41, the conductor portion 42, and the second via 4. The conductor portion 36, the conductor portion 37, the conductor portion 38, the conductor portion 39, the conductor portion 40, the conductor portion 41, and the conductor portion 42 are, for example, planar or rod-shaped conductors, and planes thereof are arranged in parallel to the xy plane.

One end of the first via 2 is connected to the first electrode 80, and the other end extends in the z direction. One end of the conductor portion 36 is connected to the other end of the first via 2, and the other end extends in the x direction. One end of the conductor portion 37 is connected to the other end of the conductor portion 36, and the other end extends in the y direction. One end of the conductor portion 38 is connected to the other end of the conductor portion 37, and the other end extends in the x direction. One end of the conductor portion 39 is connected to the other end of the conductor portion 38, and the other end extends in the −y direction. One end of the conductor portion 40 is connected to the other end of the conductor portion 39, and the other end thereof extends in the x direction. One end of the conductor portion 41 is connected to the other end of the conductor portion 40, and the other end extends in the −y direction. One end of the conductor portion 42 is connected to the other end of the conductor portion 41, and the other end extends in the x direction. One end of the second via 4 is connected to the other end of the conductor portion 42 and the other end is connected to the second electrode 82.

The second antenna conductor 86 includes the first via 2, the conductor portion 36, the conductor portion 43, the conductor portion 44, the conductor portion 45, an conductor portion 46, a conductor portion 47, the conductor portion 42, and the second via 4. The conductor portion 43, the conductor portion 44, the conductor portion 45, the conductor portion 46, and the conductor portion 47 are, for example, planar or rod-shaped conductors, and planes thereof are arranged in parallel to the xy plane.

One end of the conductor portion 43 is connected to the other end of the conductor portion 36 and one end of the conductor portion 37, and the other end extends in the −y direction. One end of the conductor portion 44 is connected to the other end of the conductor portion 43, and the other end extends in the x direction. One end of the conductor portion 45 is connected to the other end of the conductor portion 44, and the other end extends in the −y direction. One end of the conductor portion 46 is connected to the other end of the conductor portion 45, and the other end extends in the x direction. One end of the conductor portion 47 is connected to the conductor portion 46, and the other end extends in the y direction.

The first via 2, the conductor portion 36, the conductor portion 42, and the second via 4 are used in common by the first antenna conductor 84 and the second antenna conductor 86.

Even in the chip antenna 100 illustrated in the first embodiment, it is possible to suppress electromagnetic coupling between the radio wave generated by the first antenna conductor 84 and the radio wave generated by the second antenna conductor 86. However, the chip antenna 110 according to the second embodiment can further prevent electromagnetic coupling between the radio waves from the different antenna conductors. This point will be described further below.

A current flowing through the conductor portion 36 branches to the conductor portion 37 and the conductor portion 43. A current flowing through the conductor portion 37 flows to the conductor portion 38, the conductor portion 39, the fifth conductor portion 40, and the conductor portion 41. A current flowing through the conductor portion 43 flows to the conductor portion 44, the conductor portion 45, the conductor portion 46, and the conductor portion 47.

However, cancellation of a magnetic field (according to the right-handed rule) may occur between the branched conductors (current paths) of the first antenna conductor 84 and the second antenna conductor 86, but as illustrated in FIG. 7, a length of the conductor portion 37 is different from a length of the conductor portion 43, and a length of the conductor portion 41 is different from a length of the conductor portion 47. Accordingly, for example, a phase of a current flowing through the conductor portion 38 and a phase of a current flowing through the conductor portion 44 are shifted from each other in the x direction. Thus, a phase of a current flowing through the portion of the first antenna conductor 84 (e.g., the conductor portion 37, the conductor portion 38, the conductor portion 39, the conductor portion 40, and the conductor portion 41) can be different from a phase of a current flowing through the portion of the second antenna conductor 86 (e.g., the conductor portion 43, the conductor portion 44, the conductor portion 45, the conductor portion 46, and the conductor portion 47), and cancellation of the magnetic field due to an in-phase current can be avoided or alleviated. That is, the electromagnetic coupling between the radio wave generated from the first antenna conductor 84 and the radio wave generated from the second antenna conductor 86 is prevented.

In addition, since a distance between the first antenna conductor 84 and the second antenna conductor 86 can be lengthened, the electromagnetic coupling between the radio wave generated from the first antenna conductor 84 and the radio wave generated from the second antenna conductor 86 can be further prevented.

Here, a shape (e.g., a length, a width, or a film thickness) of the conductor portion 38 is the same as a shape of the conductor portion 44. In addition, a shape of the conductor portion 39 is the same as a shape of the conductor portion 45. Furthermore, a shape of the conductor portion 40 is the same as a shape of the conductor portion 46. However, a shape of the conductor portion 37 is different from a shape of the conductor portion 43. In addition, a shape of the conductor portion 41 is different from a shape of the conductor portion 47. Accordingly, the first antenna conductor 84 and the second antenna conductor 86 include portions (the conductor portion 38, the conductor portion 39, and the conductor portion 40 for the first antenna conductor 84, and the conductor portion 44, the conductor portion 45, and the conductor portion 46 for the second antenna conductor 86) having the same shape and others portions (for example, the conductor portion 37 for the first antenna conductor 84 and the conductor portion 43 for the second antenna conductor 86) having different shapes. Thereby, a configuration is achieved in which an effect of preventing the electromagnetic coupling can be easily obtained.

A shape of the conductor portion 37 is the same as a shape of conductor portion 47. In addition, a shape of the conductor portion 41 is the same as a shape of the conductor portion 43. Accordingly, a length of the first antenna conductor 84 is equal to a length of the second antenna conductor 86. In addition, an electric field of the first antenna conductor 84 is the same as an electric field of the second antenna conductor 86. The chip antenna 110 according to the second embodiment illustrates an example in which the lengths and the electric fields of the first antenna conductor 84 and the second antenna conductor 86 are substantially the same and electromagnetic coupling can be prevented.

As a result, stronger radio waves can be transmitted and received to and from the chip antenna 110.

The shapes of the first antenna conductor 84 and the second antenna conductor 86 are not limited to that specifically depicted in FIG. 7, and shapes and configurations thereof may be changed in various aspects as long as the effect of preventing the electromagnetic coupling is still obtained.

According to the circuit device of the second embodiment, it is possible to provide a chip antenna 110 which can easily adjust a communication frequency, can cope with other frequencies, and can prevent electromagnetic coupling of radio waves.

Third Embodiment

A chip antenna according to the third embodiment is different from the chip antennas according to the first embodiment and the second embodiment in that at least one of the first electrode 80 or the second electrode 82 incorporates a stub. The other points may be as described in conjunction with the first and/or second embodiment.

Figure 8:
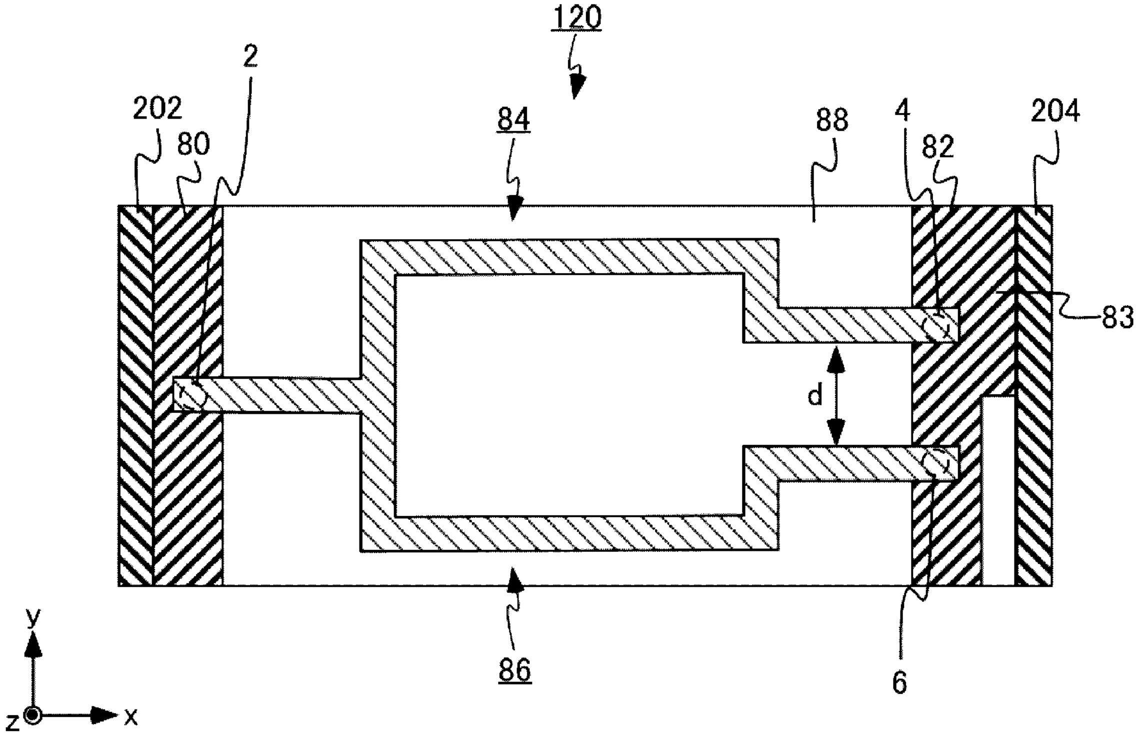
FIG. 8 is a schematic diagram of a chip antenna according to a third embodiment.

FIG. 8 is a schematic diagram of a chip antenna 120 according to the third embodiment.

In FIG. 8, a stub 83 is provided in the second electrode 82. Thereby, it is possible to easily adjust a communication frequency. The stub may instead be provided in the first electrode 80.

According to a circuit device of the third embodiment, it is possible to provide a chip antenna 120 which can easily adjust the communication frequency and can cope with other frequencies.

Fourth Embodiment

A chip antenna according to the fourth embodiment is different from the chip antennas according to the first embodiment to the third embodiment in that the first antenna conductor includes a first planar conductor (comprising conductor portion 47, conductor portion 48, and conductor portion 49), a second planar conductor (comprising conductor portion 50) provided in parallel with the first planar conductor, and a via 24 connecting the first planar conductor to the second planar conductor. The first planar conductor and the second planar conductor have portions that do not overlap in a direction perpendicular to the first planar conductor. The first antenna conductor further includes a third planar conductor (comprising conductor portion 51, conductor portion 52, conductor portion 53, and conductor portion 54) parallel to the first planar conductor and the second planar conductor and a via 26 connecting the second planar conductor to the third planar conductor. The second planar conductor is provided between the first planar conductor and the third planar conductor, and the first planar conductor and the third planar conductor have overlapping portions in a direction perpendicular to the first planar conductor. The other points may be as described in conjunction with the first, second, or third embodiments.

Figure 9A:
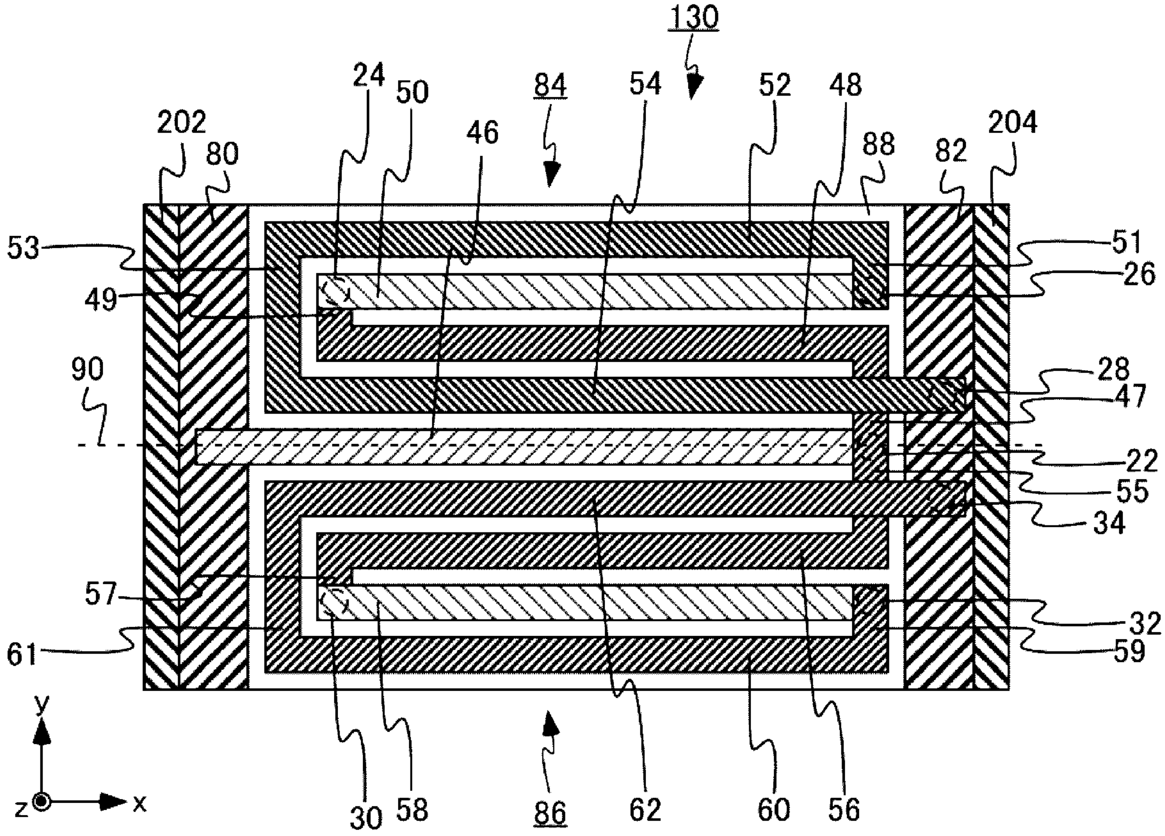
FIGS. 9A and 9B are schematic diagrams of a chip antenna according to a fourth embodiment.
Figure 9B:
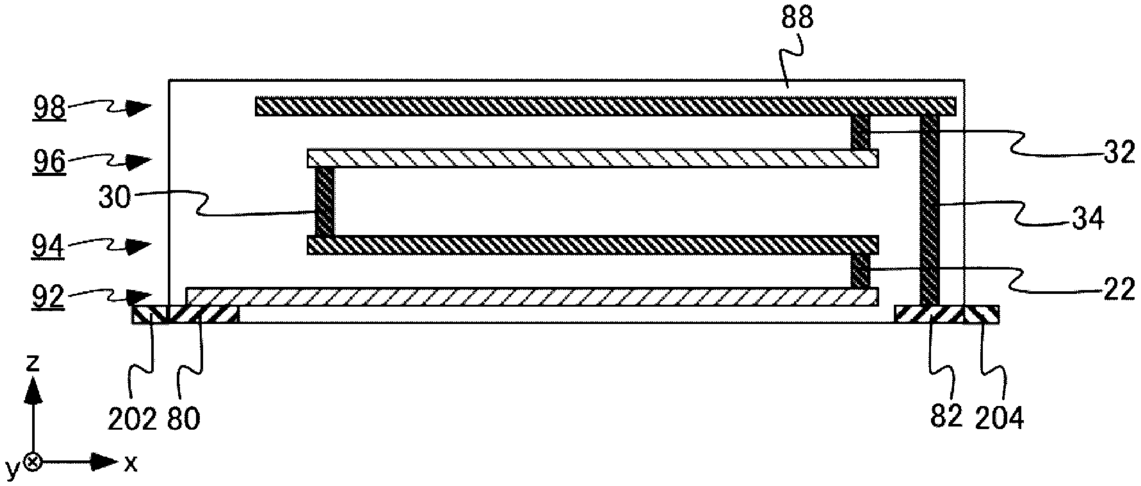

FIGS. 9A and 9B are schematic diagrams of a chip antenna 130 according to the fourth embodiment. FIG. 9A is a schematic diagram of the chip antenna 130 in a plane parallel to the xy plane. FIG. 9B is a schematic diagram of the chip antenna 130 in a plane parallel to the xz plane.

A first layer 92, a second layer 94, a third layer 96, and a fourth layer 98 which are parallel to the xy plane are considered. The first layer 92, the second layer 94, the third layer 96, and the fourth layer 98 are provided in an insulator 88 parallel to the xy plane. The second layer 94 is located on the first layer 92, the third layer 96 is on the second layer 94, and the fourth layer 98 is on the third layer 96.

The first electrode 80 and the second electrode 82 are provided in the first layer 92.

The conductor portion 46, the conductor portion 47, the conductor portion 48, the conductor portion 49, the conductor portion 50, the conductor portion 51, the conductor portion 52, the conductor portion 53, the conductor portion 54, a conductor portion 55, a conductor portion 56, a conductor portion 57, a conductor portion 58, a conductor portion 59, a conductor portion 60, a conductor portion 61, and a conductor portion 62 are examples of a “planar conductor”, and are planar and rod-shaped conductors whose planes are arranged in parallel to the xy plane.

The first antenna conductor 84 includes the conductor portion 46, a via 22, the conductor portion 47, the conductor portion 48, the conductor portion 49, a via 24, the conductor portion 50, a via 26, the conductor portion 51, the conductor portion 52, the conductor portion 53, and the conductor portion 54, and a via 28.

The conductor portion 46 is provided in the first layer 92. One end of the conductor portion 46 is connected to the first electrode 80, and the other end extends in the x direction.

One end of the via 22 is connected to the other end of the conductor portion 46 and the other end extends in the z direction.

The conductor portion 47, the conductor portion 48, and the conductor portion 49 are provided in the second layer 94. One end of the conductor 47 is connected to the other end of the via 22 and the other end extends in the y direction. One end of the conductor portion 48 is connected to the other end of the conductor portion 47, and the other end extends in the −x direction. One end of the conductor portion 49 is connected to the other end of the conductor portion 48 and the other end extends in the y direction.

One end of the via 24 is connected to the other end of the conductor portion 49, and the other end extends in the z direction.

The conductor portion 50 is provided in the third layer 96. One end of the conductor portion 50 is connected to the other end of the via 24, and the other end extends in the x direction.

One end of the via 26 is connected to the other end of the conductor portion 50, and the other end extends in the z direction.

The conductor portion 51, the conductor portion 52, the conductor portion 53, and the conductor portion 54 are provided in the fourth layer 98.

One end of the conductor portion 51 is connected to the other end of the via 26, and the other end extends in the y direction. One end of the conductor portion 52 is connected to one end of the conductor portion 51, and the other end extends in the −x direction. One end of the conductor portion 53 is connected to the other end of the conductor portion 52, and the other end extends in the −y direction. One end of the conductor portion 54 is connected to the other end of the conductor portion 53, and the other end extends in the x direction.

One end of the via 28 is connected to the other end of the conductor portion 54, and the other end extends in the −z direction and is connected to the second electrode 82.

The second antenna conductor 86 includes the conductor portion 46, the via 22, the conductor portion 55, the conductor portion 56, the conductor portion 57, a via 30, the conductor portion 58, a via 32, the conductor portion 59, the conductor portion 60, the conductor portion 61, the conductor portion 62, and a via 34.

The conductor portion 55, the conductor portion 56, and the conductor portion 57 are provided in the second layer 94. One end of the conductor portion 55 is connected to the other end of the via 22, and the other end extends in the −y direction. One end of the conductor portion 56 is connected to the other end of the conductor portion 55, and the other end extends in the −x direction. One end of the conductor portion 57 is connected to the other end of the conductor portion 56, and the other end extends in the −y direction.

One end of the via 30 is connected to the other end of the conductor portion 57, and the other end extends in the z direction.

The conductor portion 58 is provided in the third layer 96. One end of the conductor portion 58 is connected to the other end of the via 30, and the other end extends in the x direction.

One end of the via 32 is connected to the other end of the conductor portion 58, and the other end extends in the z direction.

The conductor portion 59, the conductor portion 60, the conductor portion 61, and the conductor portion 62 are provided in the fourth layer 98.

One end of the conductor portion 59 is connected to the other end of the via 32, and the other end extends in the −y direction. One end of the conductor portion 60 is connected to one end of the conductor portion 59, and the other end extends in the −x direction. One end of the conductor portion 61 is connected to the other end of the conductor portion 60, and the other end extends in the y direction. One end of the conductor portion 62 is connected to the other end of the conductor portion 61, and the other end extends in the x direction.

One end of the via 34 is connected to the other end of the conductor portion 62, and the other end extends in the −z direction and is connected to the second electrode 82.

The conductor portion 46 provided in the first layer 92 has no overlap in the z direction except for a portion connected to the conductor portion 47, the conductor portion 48, the conductor portion 49, the conductor portion 55, the conductor portion 56, and the conductor portion 57 (which are provided in the second layer 94) by the via 22.

The conductor portion 47, the conductor portion 48, and the conductor portion 49, which are provided in the second layer 94, and the conductor portion 50 provided in the third layer 96 have no overlap in the z direction except for portions connected by the via 24. The conductor portion 55, the conductor portion 56, and the conductor portion 57, which are provided in the second layer 94, and the conductor portion 58 provided in the third layer 96 have no overlap in the z direction except for portions connected by the via 30.

The conductor portion 50 provided in the third layer 96, and a conductor portion 51, the conductor portion 52, the conductor portion 53, and the conductor portion 54, which are provided in the fourth layer 98, have no overlap in the z direction except for portions connected by the via 26. The conductor portion 58 provided in the third layer 96, and the conductor portion 59, the conductor portion 60, the conductor portion 61, and the conductor portion 62, which are provided in the fourth layer 98, have no overlap in the z direction except for portions connected by the via 32.

In other words, the planar conductors provided in adjacent layers have no overlap in the z direction (a direction perpendicular to the layers) except for the portions connected by the via. Here, the first layer 92 and the second layer 94, the second layer 94 and the third layer 96, and the third layer 96 and the fourth layer 98 are examples of adjacent layers, respectively.

Thereby, it is possible to prevent electromagnetic coupling between radio waves transmitted and received in planar conductors provided in adjacent layers.

The planar conductors provided in non-adjacent layers may have an overlap in the z direction (direction perpendicular to the layers). For example, the conductor portion 47 provided in the second layer 94 and the conductor portion 54 provided in the fourth layer 98 have an overlap in the z direction. In addition, the conductor portion 55 and the conductor portion 62 provided in the fourth layer 98 have an overlap in the z direction. This is because an influence of the electromagnetic coupling will generally be small if the layers are not adjacent to each other.

According to the chip antenna of the fourth embodiment, it is possible to provide a chip antenna 130 that can prevent the influence of the electromagnetic coupling, can easily adjust the communication frequency, and can cope with multiple frequencies.

Fifth Embodiment

An antenna module according to the fifth embodiment includes the chip antennas according to any one or all of the first to fourth embodiments. Here, descriptions on contents overlapping with the first to fourth embodiments will be omitted.

Figure 10:
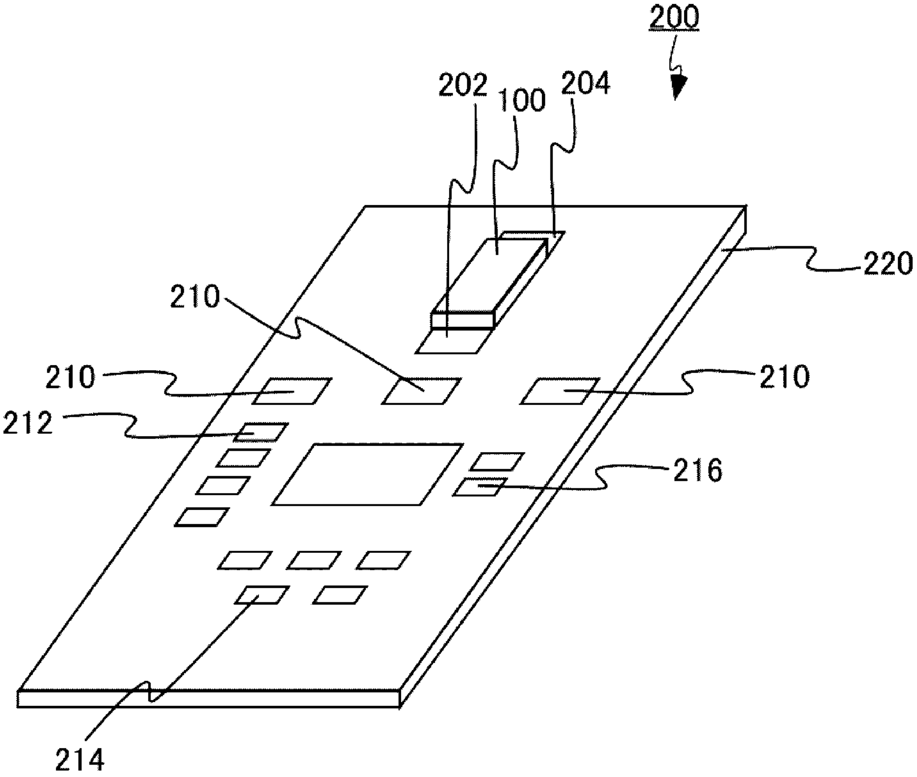
FIG. 10 is a schematic diagram of an antenna module according to a fifth embodiment.

FIG. 10 is a schematic diagram of an antenna module 200 according to the fifth embodiment.

A first substrate electrode 202 and a second substrate electrode 204 are provided on a substrate 220. The substrate 220 is, for example, a glass-reinforced epoxy substrate. The first electrode 80 of the chip antenna 100 is connected to the first substrate electrode 202. The second electrode 82 of the chip antenna 100 is connected to the second substrate electrode 204.

Electronic components 210, 212, 214, 216, and 218 are, for example, an impedance matching circuit, a band pass filter, a power amplifier, a low noise amplifier, or the like.

According to the antenna module of the fifth embodiment, it is possible to provide an antenna module 200 including a chip antenna which can easily adjust a communication frequency and can cope with multiple frequencies.

Sixth Embodiment

A communication apparatus according to the sixth embodiment includes the antenna module according to the fifth embodiment.

Figure 11:
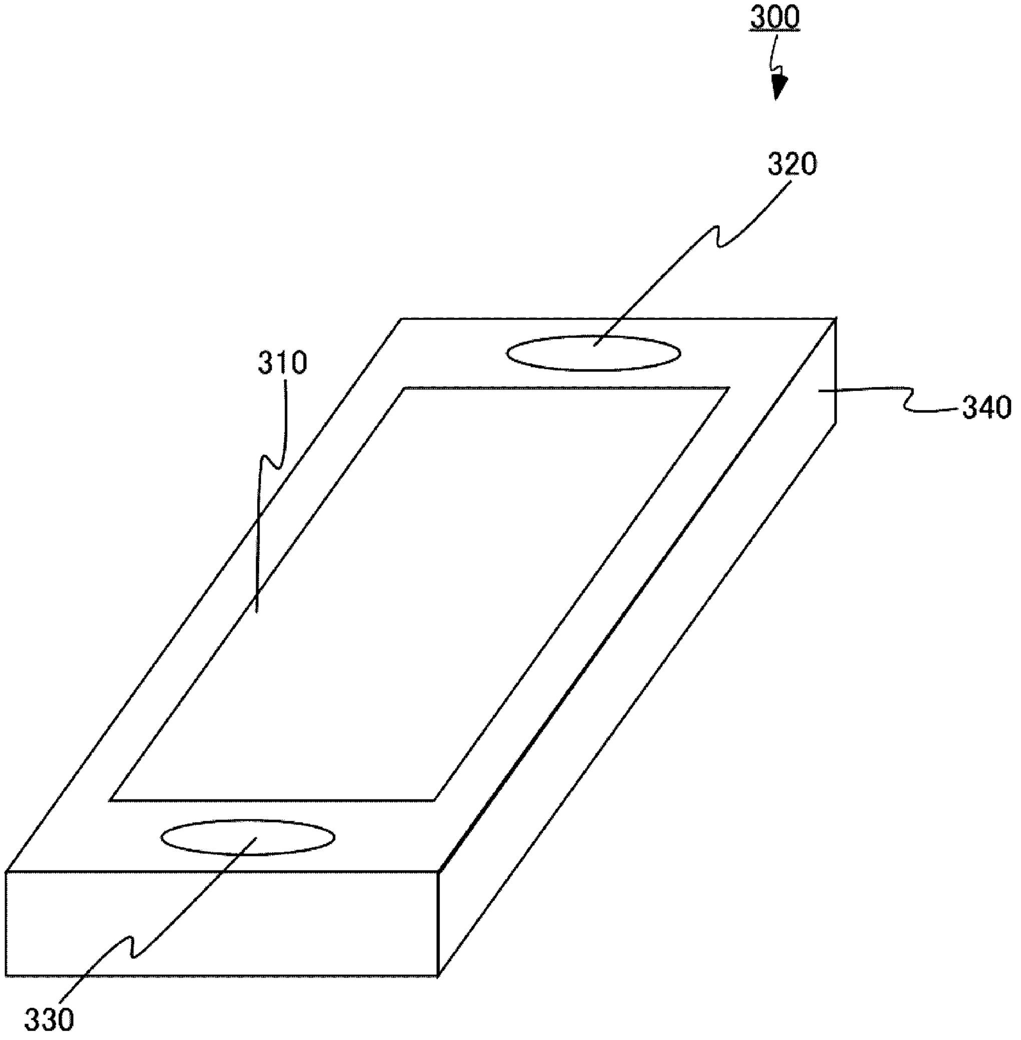
FIG. 11 is a schematic diagram of a communication device according to a sixth embodiment.

FIG. 11 is a schematic diagram of a communication apparatus 300 according to the sixth embodiment. The communication apparatus 300 is a mobile phone, for example.

The antenna module 200 is included within a case 340 of the communication apparatus 300. It is preferable to use, for example, a liquid crystal display, an organic EL display, or the like as the display portion 310. A voice signal of another party received via the chip antenna 100 is reproduced by a speaker 320. A voice signal through received from a user via a microphone 330 is transmitted by the chip antenna 100 or the like in the antenna module 200.

The communication apparatus 300 to which an antenna module 200 is applied is not limited to a mobile phone, and may also be applied to a wireless local area network (LAN) apparatus, a Bluetooth® apparatus, or any other wireless communication devices sending or transmitting radio signals.

According to a communication apparatus of the sixth embodiment, it is possible to provide a communication apparatus 300 including a chip antenna which can easily adjust a communication frequency and can cope with multiple frequencies.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosures. The accompanying claims and their equivalents are intended to cover such forms or modifications as would fall within the scope and spirit of the present disclosure.

What is claimed is:

1. A chip antenna, comprising:

a first electrode;

a second electrode spaced from the first electrode;

a first antenna conductor connected to the first electrode and the second electrode;

a second antenna conductor connected to the first electrode and the second electrode; and an insulator surrounding the first electrode, the second electrode, the first antenna conductor, and the second antenna conductor.

2. The chip antenna according to claim 1, wherein a path length of the first antenna conductor between the first and second electrodes is equal to a path length of the second antenna conductor between the first and second electrodes.

3. The chip antenna according to claim 1, wherein the first antenna conductor and the second antenna conductor are plane-symmetric with respect to a plane between the first and second electrodes.

4. The chip antenna according to claim 1, wherein the first antenna conductor includes a first portion having a first shape and a second portion connected to the first portion and having a second shape, and the second antenna conductor includes a third portion having the first shape and a fourth portion connected to the third portion and having a third shape different from the second shape.

5. The chip antenna according to claim 1, wherein the insulator has a rectangular cuboid shape, the first electrode and the second electrode are at a lower surface of the insulator, and at least one of the first antenna conductor and the second antenna conductor are connected to one of the first or second electrodes via a via connection inside the insulator.

6. The chip antenna according to claim 1, wherein the second electrode includes a stub.

7. The chip antenna according to claim 1, wherein the first and second antenna conductors are within a common level within the insulator.

8. A packaged antenna, comprising:

an insulator material having a lower surface;

a first electrode exposed at the lower surface of the insulator;

a second electrode exposed at the lower surface of the insulator and spaced from the first electrode;

a first antenna conductor inside the insulator and electrically connected to the first electrode and the second electrode; and a second antenna conductor inside the insulator and connected to only one or the other of the first electrode or the second electrode, wherein the first antenna conductor is at height from the lower surface that is different from the second antenna conductor.

9. The packaged antenna according to claim 8, wherein the first antenna conductor and the second antenna conductor have planar shapes which are symmetric about an axis between the first and second electrodes.

10. The packaged antenna according to claim 9, wherein the second antenna conductor is connected to the only one or the other of first electrode or the second electrode with a via connection extending inside the insulator in a vertical direction orthogonal to the lower surface.

11. The packaged antenna according to claim 10, wherein the first and second antenna conductors include a shared portion that is connected directly to the via connection.

12. A chip antenna, comprising:

a first electrode;

a second electrode spaced from the first electrode;

a first antenna conductor connected to the first electrode and the second electrode;

a second antenna conductor connected to at least one of the first electrode and the second electrode; and an insulator surrounding the first electrode, the second electrode, the first antenna conductor, and the second antenna conductor, wherein the insulator has a rectangular cuboid shape, the first electrode and the second electrode are at a lower surface of the insulator, and at least one of the first antenna conductor and the second antenna conductor are connected to one of the first or second electrodes via a via connection inside the insulator.

13. The chip antenna according to claim 12, wherein the first antenna conductor and the second antenna conductor are plane-symmetric with respect to a plane between the first and second electrodes.

* * * * *